United States Patent [19]

Harvey et al.

[11] Patent Number: 5,037,622
[45] Date of Patent: Aug. 6, 1991

[54] WET-TIP DIE FOR EFG CRYSTAL GROWTH APPARATUS

[75] Inventors: David S. Harvey; Dana L. Winchester, both of Groton; Brian H. Mackintosh, Concord, all of Mass.; Sankerlingam Rajendran, Nashua, N.H.

[73] Assignee: Mobil Solar Energy Corporation, Billerica, Mass.

[21] Appl. No.: 553,903

[22] Filed: Jul. 13, 1990

[51] Int. Cl.$^5$ .............................................. C30B 15/34
[52] U.S. Cl. .................................... 422/249; 422/246; 422/253; 156/DIG. 83; 156/DIG. 88; 156/DIG. 93; 156/DIG. 115
[58] Field of Search ........................ 422/246, 249, 253; 423/DIG. 5; 156/608, DIG. 73, DIG. 83, DIG. 88, DIG. 93, DIG. 115

[56] References Cited

U.S. PATENT DOCUMENTS

| | | | |
|---|---|---|---|
| 4,118,197 | 10/1978 | Mackintosh et al. | 422/249 |
| 4,230,674 | 10/1980 | Taylor et al. | 422/249 |
| 4,239,734 | 12/1980 | Taylor et al. | 422/249 |
| 4,271,129 | 6/1981 | Berkman et al. | 422/249 |
| 4,544,528 | 10/1985 | Stormont et al. | 422/246 |
| 4,661,324 | 4/1987 | Sink et al. | 422/249 |
| 4,721,688 | 1/1988 | Stormont et al. | 422/249 |

Primary Examiner—Olik Chaudhuri
Assistant Examiner—Felisa Garrett-Meza
Attorney, Agent, or Firm—Pandiscio & Pandiscio

[57] ABSTRACT

A novel capillary die and crystal growing method are provided for growing a hollow crystalline body by EFG. Inner and outer annular moats surround the die tip. Passageways are provided for supplying melt to those moats from a crucible, so that melt in said moats will wet and cover the inner and outer exterior surfaces of the die tip during growth of a hollow crystalline body. The novel die may be constructed so as to have a lower die tip and a shorter capillary than EFG dies heretofore used to successfully grow hollow bodies. The die design facilitates keeping the temperature of the die tip substantially uniform about its circumference, thereby improving the uniformity of thickness of the wall of the crystalline body grown from a film of melt on the die tip. The moats reduce the likelihood of the growth process being interrupted or adversely affected by flooding of the die. In the event the growth meniscus breaks, liquid silicon is captured in the moats, thereby preventing or reducing the likelihood of flooding of the die and associated growth apparatus.

13 Claims, 4 Drawing Sheets

WET-TIP DIE FOR EFG CRYSTAL GROWTH APPARATUS

FIELD OF THE INVENTION

This invention relates to apparatus for growing crystalline bodies from a melt by the EFG process, and more particularly to a novel die for such apparatus.

BACKGROUND OF THE INVENTION

In the edge-defined, film-fed, crystal growth technique (the EFG process), tubular crystalline bodies, e.g., hollow bodies with round or polygonal cross-sections, are grown on a seed from a liquid film of feed material which is transported by capillary action from a crucible of molten silicon through one or more capillaries in a die to the end or top surface of the die. The shape of the crystalline body is determined by the external or edge configuration of the uppermost or top end surface of the die. Polygonally-shaped hollow bodies, e.g., "nonagons" or "octagons", grown by EFG are subdivided at their corners into a plurality of flat substrates that are used to form photovoltaic solar cells.

Known EFG dies of the type described and illustrated in U.S. Pat. No. 4,230,674 to Taylor et al. typically comprise an upper end surface, at least one capillary which intersects said upper end surface, and inner and outer side surfaces which intersect the upper end surface at about a 65° angle, i.e., at about a 25° angle to the vertical axis of the die.

With known EFG dies it tends to be difficult to initiate crystal growth, i.e. seed the crystal growth apparatus, for at least two reasons. First, crystal growth must be initiated within a relatively narrow range of die temperatures, i.e. the "growth window". Second, significant variations in temperature tend to exist around the circumference of the die.

The first of the above-discussed reasons contributes to some extent to the second of the above-discussed reasons. Crystal growth will not occur at a temperature below the growth window, i.e. the seed will freeze to the die. When crystal growth is attempted at a temperature above the narrow range of die temperatures where crystal growth is possible, the liquid film between the die and the seed (or growing crystal) will tend to rupture, i.e., the seed will break away from the liquid film, with the result that often the liquid silicon splashes onto or overflows the inner and/or outer side surfaces of the die. The spilled silicon tends to react to form silicon carbide deposits on the side surfaces of the die. Additionally, some silicon carbide will form on the side surfaces of the die in connection with the normal crystal growth process. These silicon carbide deposits, together with any unreacted liquid silicon on the side surfaces of the die, tend to change the thermal conductivity and emissivity of the die. Such changes in conductivity and emissivity will cause a localized change in the rate of loss of heat, with the result that the temperature around the circumference of the die is not even.

Thermal symmetry around the circumference of the die is further adversely affected by unavoidable subtle variations in the porosity, density and/or electrical conductivity of the graphite from which the die is made. These variations in graphite properties produce local variations in heat flow and cause variations in the depth to which spilled silicon will penetrate into the surfaces of the die, which in turn affects the temperature of the die.

Variations in thermal symmetry around the circumference of the die cause local changes in thickness of the growing crystalline body. Such variations in thickness tend to reduce the number of solar cells which can be produced from the hollow polygonal crystalline body, inasmuch as the thinner substrates cut from the crystalline body tend to be prone to breakage. Furthermore, the surfaces of substrates cut from crystalline bodies tend to be uneven due to the variations in thickness. This unevenness makes it more difficult to perform certain solar cell processing operations, such as attaching electrodes to the surfaces of the substrate.

As noted earlier, with known EFG crystal growth apparatus, when the menisci are ruptured, i.e., when the solid/liquid interface is terminated, liquid silicon tends to overflow the die, and such overflow may cause some flooding of some portions of the crystal growth apparatus adjacent the die. Such flooding of molten silicon results in thermal non-uniformities, as described above, and when excessive, can destroy the growth setup by fusing together the die and adjacent mechanical parts of the growth apparatus, and can possibly contaminate the molten silicon in the crucible and otherwise damage the crystal growth apparatus.

To avoid breakage of or interruption of the growth meniscus, it is essential for the human operator to use a high level of care and diligence in operating the growth apparatus. This high level of care is difficult for operators to maintain at all times, so that mishaps inevitably occur, with the result that the average useful life of EFG dies is significantly shortened by the mechanisms of non-uniform wetting and catastrophic flooding.

With known EFG dies there exists during crystal growth a large difference in temperature, or temperature gradient, between the growth meniscus at the top of the die and the bulk melt in the crucible, with the bulk melt having a much higher temperature than the melt in the growth meniscus. A large temperature gradient is desired in the growth meniscus itself to maintain stability in the crystal growth process. In known EFG dies a large temperature gradient in the growth meniscus results in a similar large temperature gradient in the die capillary between the growth meniscus and the melt in the crucible, due to continuity of heat flow through the die into the meniscus, and due to the high thermal resistance of the die.

An undesirable result of the required high temperature in the crucible can be the excess dissolution of the crucible material into the melt. As the melt flows up the die capillary from the crucible to the die top, the melt decreases in temperature and becomes supersaturated, so that the dissolved and reacted crucible materials will precipitate in the die capillaries and at the die tip. These precipitates can cause the capillary passage(s) to become clogged, preventing melt from reaching the die top, and thereby preventing further crystal growth. The precipitates can also alter the shape of the die top and the edges of the die top, thus changing the shape of the crystal grown from the die in undesirable ways.

OBJECTS AND SUMMARY OF THE INVENTION

One object of the present invention is to provide an improved crucible/die assembly for an EFG crystal growth system characterized in that the circumferential temperature profile of the die is not changed significantly as a result of (1) rupture of the liquid film between the die and the growing crystalline body and the resultant spillage of molten silicon onto outer surfaces of the die, or (2) as a consequence of normal operation of the crystal growth apparatus.

Another object of the invention is to increase the tolerance for die temperature variations without (1) the crystalline body freezing to the die and (2) the crystalline body "voiding", i.e., breaking away from the liquid film connecting it to the die.

Still a further object of the present invention is to provide a crucible/die unit for an EFG crystal growth apparatus which is designed to prevent the flooding of regions of the apparatus adjacent the die with molten silicon which is released upon rupture of the menisci between the die and the growing crystalline body.

Yet another object of the present invention is to provide an EFG crystal growth apparatus which is easier to seed.

Still another object of the present invention is to provide an EFG crystal growth apparatus having a crucible die which is designed to achieve the objects set forth above.

A further object of the invention is to decrease the temperature difference between the die top and the melt in the crucible, and to decrease the temperature gradient in the melt in the die capillaries, so as to decrease the supersaturation of the melt and thus reduce the precipitation of dissolved and reacted crucible material in the capillaries and at the die top.

Another object of the invention is to provide a new and improved method of growing a tubular crystalline body from a pool of melt.

The foregoing and other objects of this invention are achieved by providing an apparatus for growing tubular bodies by EFG comprising a novel EFG die and a crucible having a side wall and a bottom wall defining a space for containing a supply of molten silicon ("the reservoir of melt"). The die comprises an upstanding tip of polygonal cross-section having a top end surface and inner and outer side surfaces which intersect the top end surface of the die. The die tip comprises one or more feed capillaries, i.e., passageways of capillary proportions each characterized by having an upper end which terminates at said top end surface of the die and a lower end which communicates with the melt in the crucible. The die also includes concentric first and second (inner and outer) annular moats. The inner moat is adjacent the inner side surface of the die tip and is designed to contain a quantity of silicon melt that contacts the inner side surface of the die tip. The outer moat is adjacent the outer side surface of the die tip and is designed to contain a quantity of silicon melt that contacts the outer side surface of the die tip. The inner and outer moats are coupled to the melt in the crucible via one or more capillary-sized passages. As an optional measure, a third moat may be provided in surrounding relation to the second (outer) moat. The die design permits the overall height of the die to be relatively short (in comparison to prior known dies), whereby there is a smaller difference between the temperature at the top of the die tip and the temperature of the melt in the crucible.

Silicon melt is conducted by capillary action from the crucible through the capillaries to the top end surface of the die tip. Silicon melt is conducted by capillary action from the crucible through the capillary passages to the inner and outer moats. Silicon melt in the inner and outer moats is then drawn upward by surface tension along the inner and outer side die surfaces respectively, forming menisci which cover those surfaces virtually in their entirety. These "moat" menisci attach to the sides of the die tip just below its shape-defining corners, while the separate growth menisci attach to the edges of the top surface of the die tip. In the event the growth menisci rupture, or liquid silicon is otherwise spilled inwardly or outwardly relative to the die, the liquid silicon is captured in the inner or outer moats, as the case may be, where it may return to the melt in the crucible, and also in the third radially outer moat, where it is retained.

Other features and advantages of the invention are described or rendered obvious by the following description of the invention and the appended claims.

BRIEF DESCRIPTION OF THE DRAWINGS

For a fuller understanding of the nature and objects of the present invention, reference should be made to the following detailed description taken in connection with the accompanying drawings wherein.

In the several figures, identical numbers refer to identical elements.

DETAILED DESCRIPTION OF THE INVENTION

Figure 1:
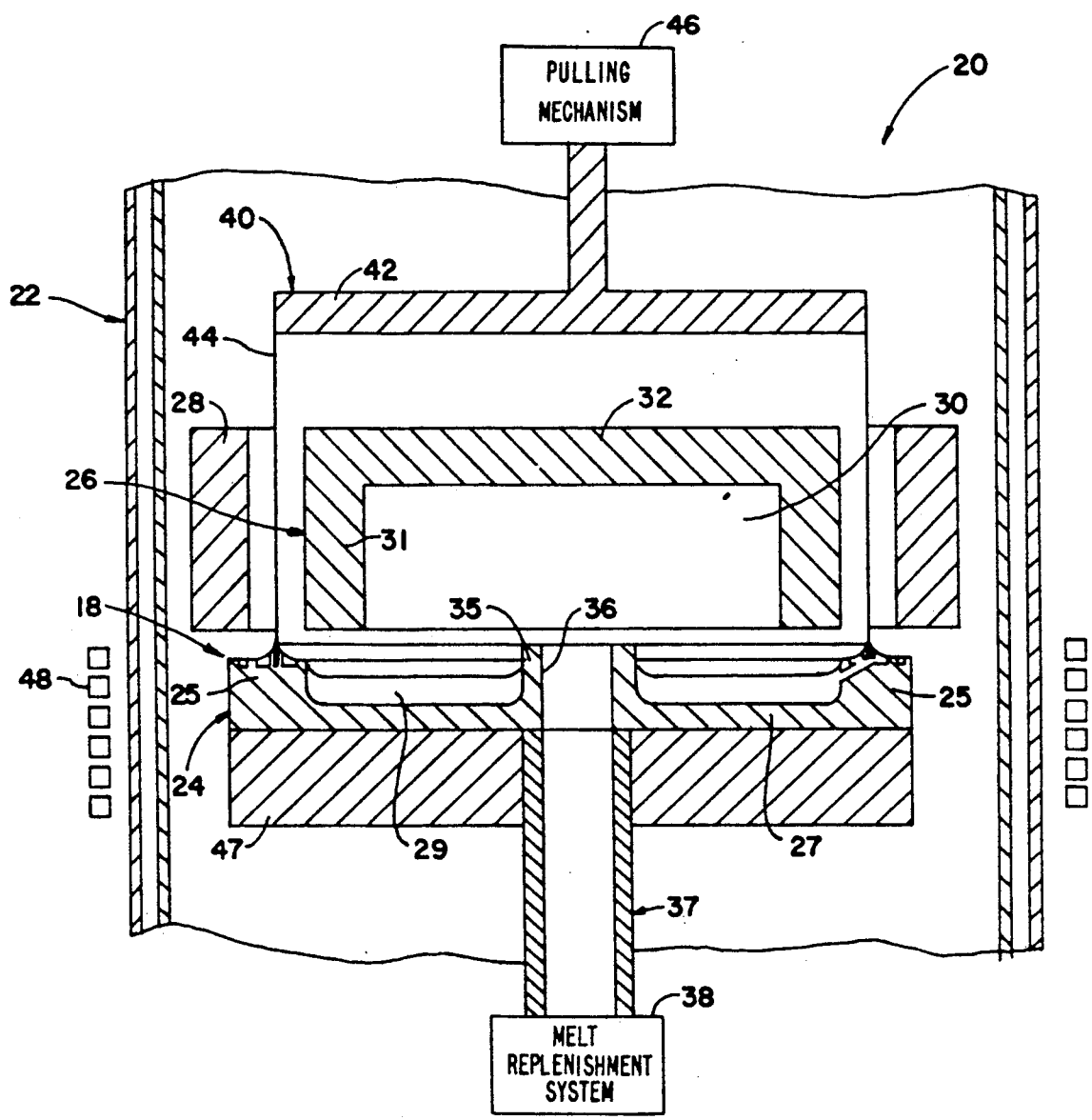
FIG. 1 is front elevation view, partly in cross section, of a conventional EFG crystal growth furnace apparatus showing how the crucible/capillary die assembly of the present invention is used.

FIGS. 1 and 3-7 illustrate a preferred embodiment of the invention which comprises a crucible/capillary die arrangement. FIG. 1 illustrates a crucible/capillary die unit 18 made in accordance with this invention installed in a EFG crystal growth apparatus 20. The latter is similar to the growth apparatus illustrated in U.S. Pat. No. 4,544,528 to Stormont et al. The crucible/capillary die unit 18 is designed so that the outside surfaces of the die tip remain wetted during the entire growth process.

By way of background, apparatus 20 comprises a furnace enclosure generally identified by numeral 22 within which is disposed the crucible/die unit 18 and inner and outer hollow after-heaters 26 and 28. The crucible/die unit comprises a crucible 24 in the form of a short, hollow, open-topped right prism or right circular cylinder centrally disposed within enclosure 22. Crucible 24 includes an upstanding sidewall 25 and a bottom wall 27 which define the space in which the melt 29 is contained. Preferably, the capillary die 19 is formed integral with and is attached to the upper end of sidewall 25.

Inner after-heater 26 is hollow and defines an interior space 30. Preferably inner after-heater 26 is a tubular member with a cylindrical or polygonal cross-sectional configuration. Inner after-heater 26 comprises a side wall 31 and a top end wall 32. The bottom end of inner after-heater 26 is open, whereby the interior 30 of the inner after-heater 26 communicates with the interior of the crucible 24.

Crucible 24 additionally comprises a center hub 35 having a center bore 36. Hub 35 is integrally attached to and extends upwardly from bottom wall 27 of the crucible. Hub 35 extends above side wall 25 so as to project above the level of the melt in the crucible. Typically, a hollow conduit 37 (FIG. 1) is coupled with hub 35. Conduit 37 is coupled with a suitable melt replenishment system 38 that is adapted for delivering solid particles of silicon feed stock through bore 36 in hub 35 into the region above the crucible, from which region the particles fall down into melt 29. By way of example, the silicon melt replenishment system 38, which does not form part of the present invention, may take the form of the chip thruster illustrated in U.S. Pat. No. 4,661,324 issued to Sink et al.

Apparatus 20 additionally comprises a seed assembly which is schematically illustrated at 40. Seed assembly 40 is positioned in enclosure 22 and includes a seed holder 42 and a seed 44. Seed assembly 40 is attached to a pulling mechanism 46 which is adapted to move seed holder 42 axially toward and away from die 18.

Apparatus 20 further includes a heat susceptor 47 and a heating coil 48 that surrounds enclosure 22 adjacent crucible 24. Susceptor 47 is a short body which is positioned directly below, and serves as a support for, die/crucible assembly 18. Although not shown, it is to be understood that a pedestal mounted in furnace enclosure 22 acts as a support for susceptor 47 and crucible/die unit 18. Susceptor 47 is made of graphite or other suitable material and is heated by suscepting electromagnetic energy generated by heating coil 48. Susceptor 47 transmits its heat to crucible 24 so as to maintain the silicon in the crucible in a molten state.

Figure 2:
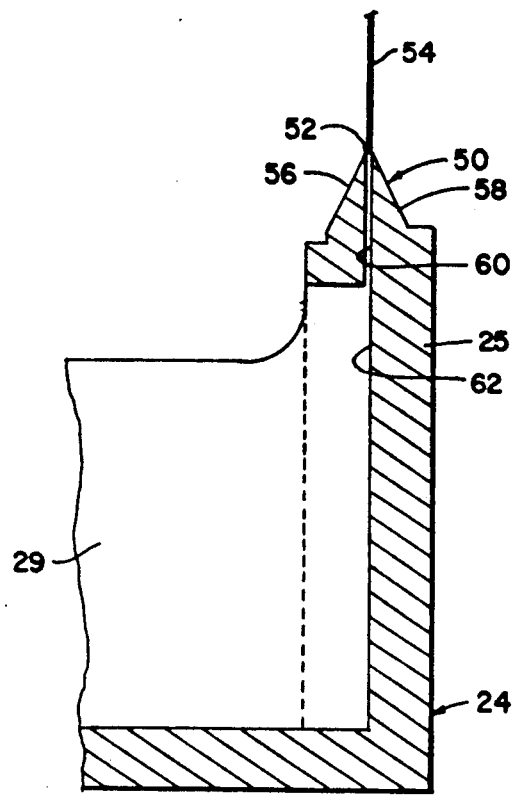
FIG. 2 is a cross-sectional view of a prior art crucible/capillary die unit.

As seen in FIG. 2, a conventional unitary crucible/capillary die assembly of the type previously used in EFG growth apparatus comprises a die tip 50 having a top surface 52 from which a hollow crystalline body 54 is grown. Die tip 50 is formed integral with the upper end of the sidewall 25 of crucible 24. Die tip 50 comprises inner and outer exterior side surfaces 56 and 58 which taper downwardly from top surface 52 so as to form an acute angle (preferably not exceeding about 30°) with respect to the growth axis of crystalline body 54. Die top surface 52 is coupled with melt 28 in crucible 24 via a vertical capillary slot 60 that extends down from the die top surface to a chamber 62 that communicates with the interior of the crucible.

Figure 3:
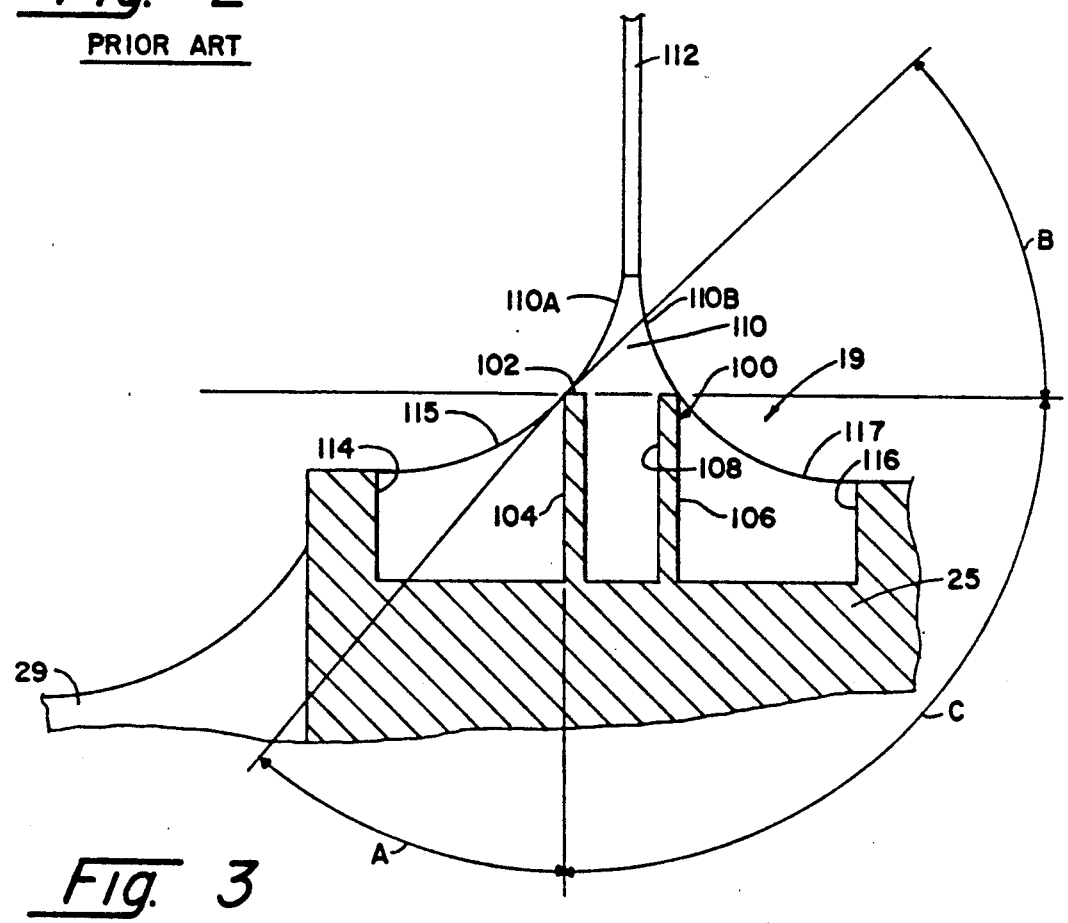
FIG. 3 is a schematic fragmentary cross-sectional view of a crucible/capillary die unit incorporating the present invention.
Figure 4:
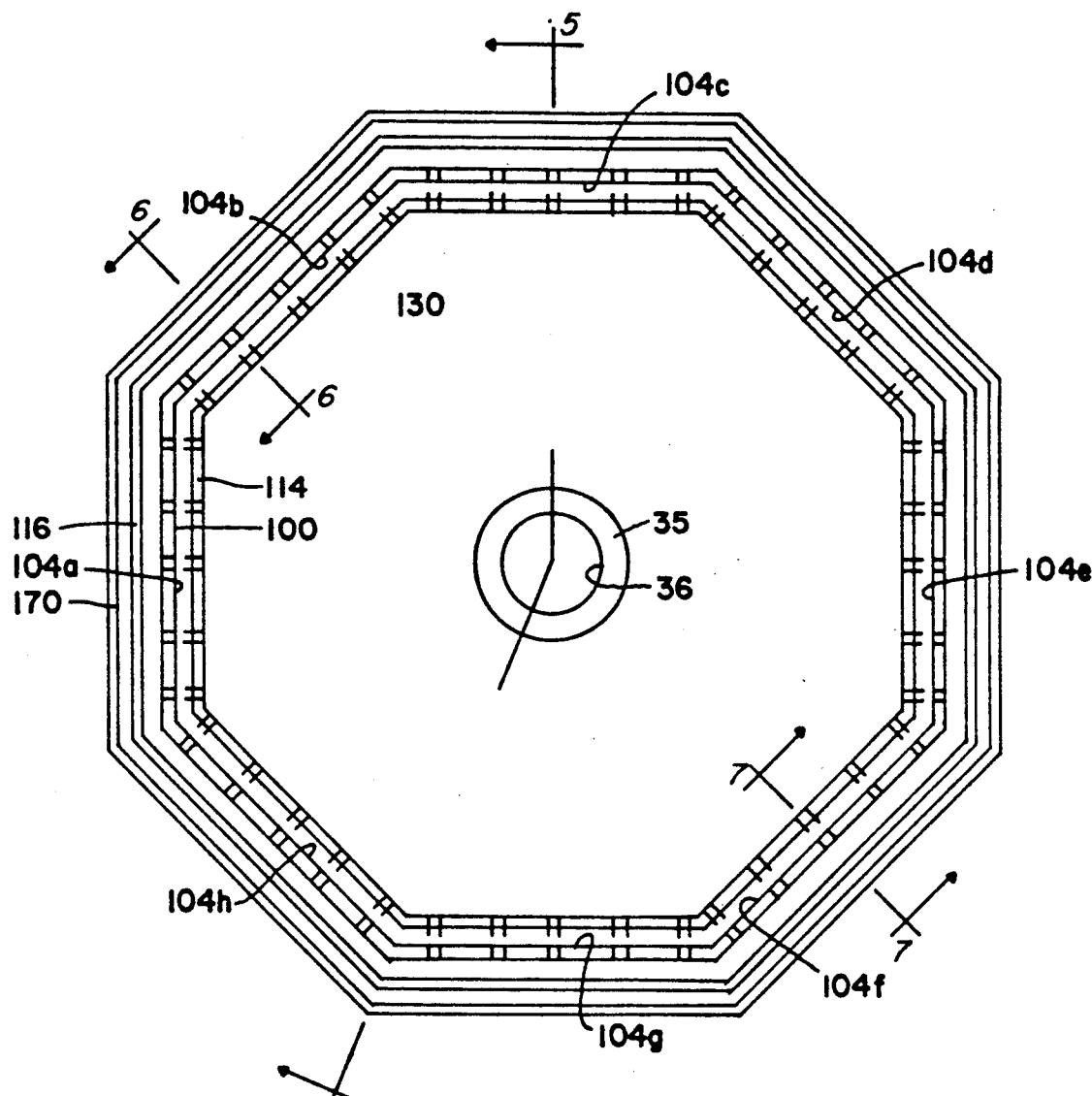
FIG. 4 is a plan view of the crucible/capillary die unit shown in FIGS. 1, 3 and 5-7.
Figure 5:
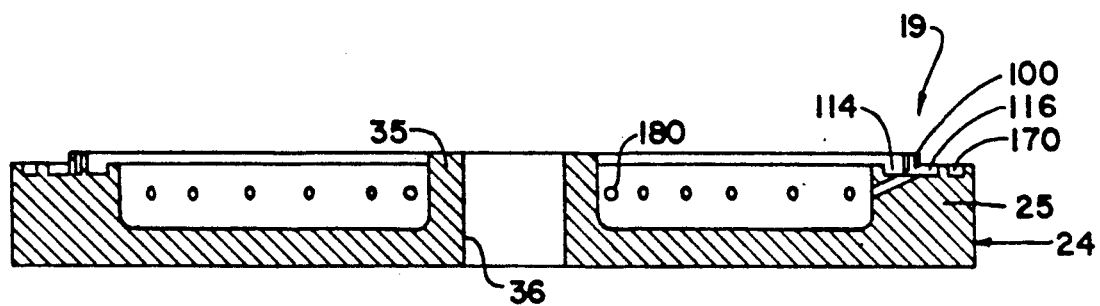
FIG. 5 is a cross sectional view taken along line 5—5 in FIG. 4.
Figure 6:
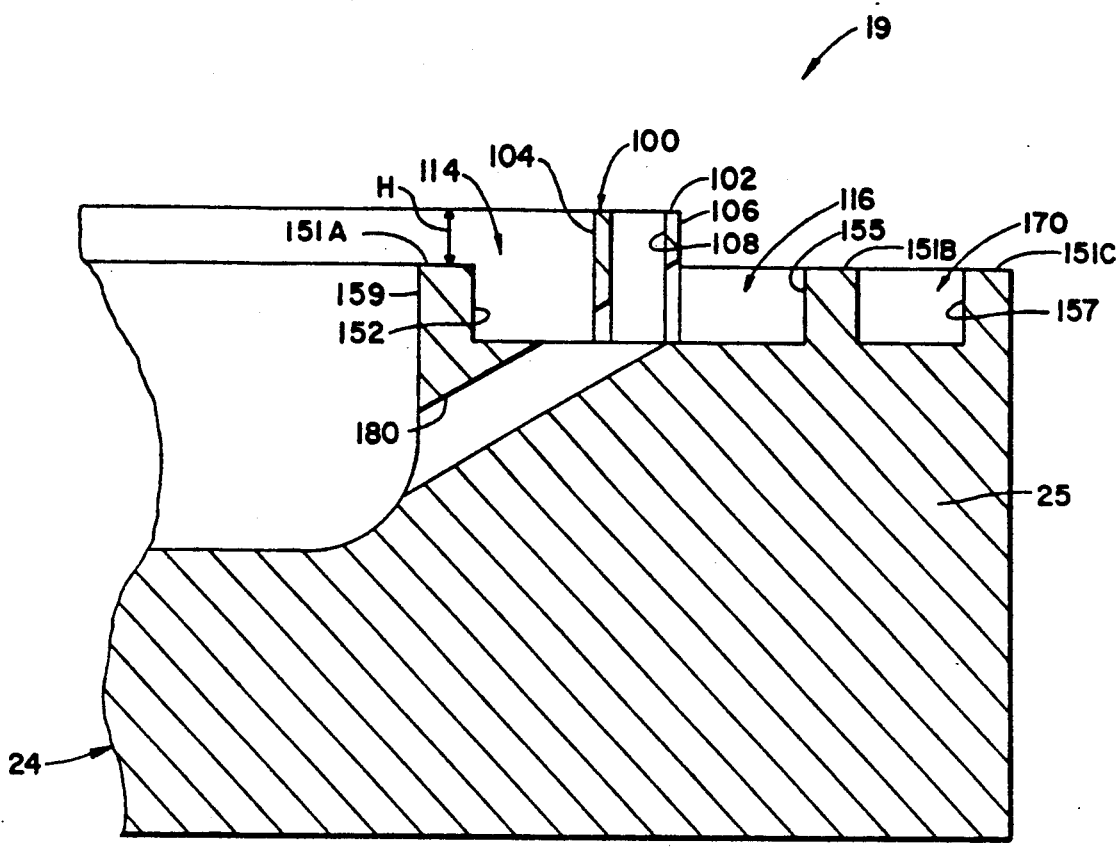
FIG. 6 is an enlarged, cross-sectional view taken along line 6—6 in FIG. 4.

Referring now to FIGS. 3–7, the present invention, broadly defined, comprises an EFG capillary die 19 which is designed so that the outer surfaces of the tip of the die are covered with liquid silicon during the entire growth process. The die, which is illustrated schematically in FIG. 3 and in greater detail in FIGS. 4–7, comprises an upstanding die tip 100 formed integral with the upper end of side wall 25. Die tip 100 has a polygonal, e.g., octagonal or nonagonal, cross-sectional configuration, although it may also have a circular, linear or other configuration. More specifically, the inner and outer surfaces of die tip 100 each have a polygonal, e.g., octagonal or nonagonal, cross-sectional configuration. As seen best in FIG. 3, die tip 100 has a top end surface 102 which preferably is flat and extends parallel to the surface of the melt in crucible 24, an inner exterior side surface 104 of polygonal configuration, and an outer exterior side surface 106 of like polygonal configuration. Thus, as seen in FIG. 4, side surface 104 actually comprises eight facet-like surface sections 104a–104h. Side surface 106 also comprises eight facet-like surface sections corresponding to surface sections 104a–104h. Surfaces 104 and 106 extend perpendicular to, and intersect, top surface 102. Die tip 100 also includes a central slot 108 having a width, i.e. a radial dimension, of capillary size, e.g. a width ranging from about 0.01" to about 0.19" depending on materials and conditions.

As described in greater detail below in conjunction with the description of the preferred embodiment of the invention shown in FIGS. 4–7, crucible/die unit 18 is constructed with two moats 114 and 116 located in the upper end of side wall 25 on opposite sides of the die tip. Moats 114 and 116 are defined in part by side surfaces 104 and 106, respectively. Means shown in FIGS. 4–7 are provided so that liquid silicon is conducted from crucible 24 to the bottom of capillary slot 108 and into the moats 114 and 116. This liquid silicon rises in slot 108 by capillary action to top surface 102 and is drawn in moats 114 and 116 by surface tension action up along exterior surfaces 104 and 106. Inner and outer moat menisci 115 and 117 are formed at exterior surfaces 104 and 106 by surface tension action. These menisci are maintained during crystal growth, so that inner and outer side surfaces 104 and 106 of die tip 100 remain wetted during the entire crystal growth process. The formation of moat menisci 115 and 117 is described below in greater detail. Referring to FIG. 3, in the course of initiating EFG crystal growth, a growth film 110, characterized by inner and outer growth menisci 110A and 110B, is formed between top surface 102 and the bottom of the growing crystalline body 112.

To ensure that liquid silicon may be conducted to top surface 102 via slot 108 and may rise by surface tension to the upper end edges of surfaces 104 and 106, it is important that the melt level in crucible 24 be maintained within a proper range. If the melt level is too low, the moat menisci 115 and 117 either may not form or may not rise up to the upper edges of side surfaces 104 and 106. If the melt level in the crucible is too high, the moat menisci 115 and 117 may become an extension of growth menisci 110A and 110B, thereby submerging top surface 102 of die tip 100 and causing the crystal growth to cease being "edge-defined", i.e., the shape of the growing crystalline body will no longer be determined by the inner and outer edge configurations of upper end surface 102.

In this connection, with reference to FIG. 3, it has been determined that to prevent moat menisci 115 and 117 from becoming extensions of growth menisci 110A and 110B, it is necessary that the sum of the wetting angle A (FIG. 3) for moat meniscus 115, the wetting angle B (FIG. 3) for growth meniscus 110A, and the angle C (FIG. 3) between side surface 104 and upper end surface 102 should always be less than 180°. The same requirement exists for the sum of the wetting angles for menisci 117 and 110B and the angle C.

It should be appreciated that it is not necessary that upper end surface 102 be flat or that angle C be 90° (although that is the case in the preferred embodiment shown in the drawings). Instead angle C has the constraint that angles A+B+C total less than 180°, and angles A and B are each greater than or equal to the equilibrium contact angle of the melt on the die material (the equilibrium contact angle of liquid silicon on graphite is 30°).

The width of moats 114 and 116, the height of top end surface 102 above the surface of the melt in crucible 24, the width of top surface 102, and the level of the melt in crucible 24 may all be varied, so long as the constraint that angles A+B+C<180° is maintained.

Various melt replenishment systems may be used in practicing the present invention, provided that they are controlled so as to maintain the level of melt in crucible 24 within a range which results in meniscus-attachment angles conforming to the formula discussed above. A suitable melt replenishment system is the one described in U.S. Pat. No. 4,661,324.

Prior to the initiation of crystal growth, the melt in crucible 24 is maintained at a level such that liquid silicon is conducted by capillary action to the upper end of slot 108 and moat menisci 115 and 117 are formed so as to wet the outside surfaces 104 and 106, respectively, of the die tip as shown in FIG. 3.

Referring to FIGS. 1 and 3, crystal growth is initiated by lowering seed holder 42 down until seed 44 contacts top surface 102 of die 100 and begins to melt. The seed is held stationary until the liquid silicon formed by its melting connects with the melt in slot 108. Then, seed 44 is pulled upwardly away from the top surface 102 so as to form a growth film 110 having inside and outside growth menisci 110A and 110B between the seed and the top surface. As the seed is pulled away from the top surface 102, the portion of the growth film 110 closest to the seed solidifies. As the seed crystal is pulled ever farther away from the die, new molten silicon is drawn by capillary action up central slot 108 to replenish growth film 110, and additional molten silicon present in the growth film solidifies and accretes to the solidified silicon attached to the seed, so as to form an elongate hollow crystalline body 112 with a cross-sectional configuration determined by the edge configuration of top end surface 102.

Preferred Embodiment

Referring now to FIGS. 4–7, the preferred embodiment of the present invention constitutes a one-piece crucible/die unit 18 with the die 19 disposed at and projecting above the top end surface 151 (FIG. 6) of the sidewall 25 of crucible 24. As discussed above in connection with the schematic representation of die 19 illustrated in FIG. 3, die 19 of the preferred embodiment includes an upstanding die tip 100 having a top surface 102, inner and outer outside surfaces 104 and 106, and a central capillary slot 108.

The crucible/die unit further includes an inner moat 114, an outer moat 116, and an overflow moat 170. Inner moat 114 is formed by a groove 152 (FIG. 6) in the upper end surface 151 of side wall 25 formed adjacent to but spaced from side surface 104. Preferably, the configuration of inner moat 114, as seen in a plan view (see FIG. 4), corresponds to that of die tip 100. Thus, for instance, if die tip 100 has a nonagon configuration, then inner moat 114 also has a nonagon configuration.

Outer moat 116 is similar in configuration to inner moat 114, except that it is positioned adjacent outer side surface 106 of die tip 100. Moat 116 is formed by a groove 155 in the upper end surface 151 of side wall 152. The plan view configuration of outer moat 116 also corresponds to the configuration of die tip 100.

Overflow moat 170 surrounds and is spaced radially from outer moat 116. Moat 170 is formed by a space 157 in the upper end of side wall 25. Preferably, moat 170 is spaced from moat 116 by an amount in the range of about 0.01" to about 0.25", and is approximately as deep as outer moat 116. Preferably, but not necessarily, moats 114, 116 and 170 have a rectangular cross-section, as viewed in FIG. 6. Preferably, the configuration of overflow moat 170, as seen in plan view, also corresponds to that of die tip 100.

The radial dimensions or widths of moats 114 and 116 are of capillary proportions, while the corresponding dimensions of moat 170 may be of capillary size or greater.

Die 18 also includes a plurality of circumferentially-spaced inclined passageways 180 formed in sidewall 25 of crucible 24. Preferably, but not necessarily, passageways 180 are inclined at an angle of about 30 degrees to the horizontal axis of the die (i.e., about 60 degrees from the vertical or longitudinal axis of the die). Each passageway 180 has a cross-section of capillary size, preferably with a maximum diameter of about 0.20". Passageways 180 are positioned so that they intersect (1) a bottom corner of groove 152, (2) central slot 108, (3) groove 155, and (4) the interior surface 159 of side wall 25. As a result, inclined passageways 180 couple inner and outer moats 114 and 116 and central slot 108 with the interior of crucible 24, thereby permitting liquid silicon to be conducted by capillary action from crucible 24 to the inner and outer moats and the central slot, as discussed hereinafter.

To optimize the operation of the present invention, it is important that the height and width of die tip 100, and the width of capillary slot 108, be within certain dimensional limits. In this connection, it is preferred that the die tip 100 shown in FIGS. 4–7 be formed (a) so that its top surface 102 is positioned closer to the surface of the melt in crucible 24 than is the top surface of conventional EFG dies of the type illustrated in FIG. 2, and (b) so that the overall width of top surface 102, measured between surfaces 104 and 106, is greater than the width of conventional EFG dies of the type illustrated in FIG. 2.

Specifically, it is preferred that die tip 100 be formed so that the distance H (FIG. 6) between the top surface 102 of the die and the corresponding top surface 151A at the other side of moat 114 (or the corresponding top surfaces 151B at the upper end of moats 116) ranges from about 0.05" to 0.09", and is preferably about 0.07". Of course, the distance between top surface 102 and the surface of the melt 29 in crucible 24 will depend upon the level of the melt in crucible 24 and will be somewhat greater than distance H (FIG. 6), since normally the crucible is not filled with melt to the top edge thereof. However, the height of surface 102 above the permissible level of the melt in the crucible and moats 114 and 116 should not be greater than that height which allow capillary rise of the melt in both die capillary slot 108 and in the moats to reach the full height of the die top along surfaces 104 and 106 to the edge of top surface 102. By way of example but not limitation, the level of the melt in the crucible should be maintained within the range of 0.15" to 0.56", preferably between 0.26" and 0.34". The width of top surface 102 measured between surfaces 104 and 106 preferably ranges from 0.02" to 0.20", with a width of 0.08" being most preferred.

In the preferred embodiment of die 19, capillary slot 108 has a width ranging from 0.01" to 0.19", with a width of about 0.04" being preferred.

In connection with the following description of the operation of the die 18 of the preferred embodiment of the present invention, it is assumed that prior to the commencement of the growth process, and continuously during the growth process, the level of liquid silicon in crucible 24 is maintained within certain predetermined limits by appropriate replenishment of the melt.

Once crucible 24 contains liquid silicon, the latter is conducted by capillary action through inclined passageways 180 to inner moat 114, central slot 108 in die tip 100, and outer moat 116. The inner and outer moats fill with liquid silicon to a level such that liquid silicon contacts inner and outer side surfaces 104 and 106.

Figure 7:
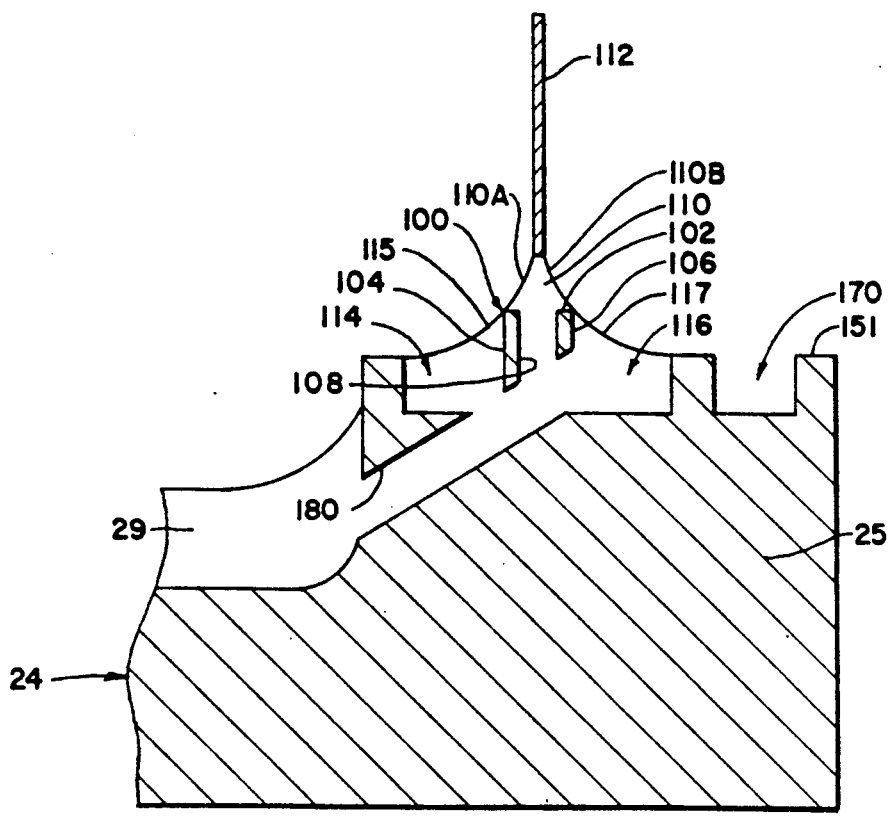
FIG. 7 is an enlarged, cross-sectional view taken along line 7—7 in FIG. 4, with the growing crystalline body and the growth and moat menisci being shown in conjunction with the die.

The liquid silicon in moats 114 and 116 rises by surface tension action up along inner and outer side surfaces 104 and 106, respectively, thereby forming moat menisci 115 and 117 (FIG. 7). The liquid silicon rises on surfaces 104 and 106 approximately to the junction of surfaces 104 and 106 and top surface 102, while the growth menisci 110A and 110B extend between the edges of the top surface 102 of die 100 and the growing crystalline body.

The crystal growth process is initiated and maintained in substantially the same manner described above in connection with the generic description of the present invention and illustrated in FIG. 3. As the seed crystal is pulled away from the die, a hollow silicon body is grown onto the seed. The source material for crystal growth is supplied entirely from liquid silicon transported by capillary action up via slot 108 to top surface 102. During the growth operation, top surface 102 and outer surfaces 104 and 106 remain wetted with liquid silicon.

Occasionally, typically at the initiation or termination of the growth process, the growing crystalline body may detach from the growth interface, e.g., as a result of excessive die temperature or an excessive pulling speed. As a result of such detachment, liquid silicon may spill away from the die tip into inner and outer moats 114 and 116. Under certain circumstances, some liquid silicon will spill beyond the inner and outer moats into the crucible 24 or into overflow moat 170. The liquid silicon that spills into inner and outer moats 114 and 116 does not affect the growth process because these moats already contain liquid silicon. Typically, the liquid silicon that spills into overflow moat 170 remains there and is disposed of along with the die after the growth process has been completed.

Advantages of the Present Invention

As noted above, known EFG dies, e.g., dies as shown in the '528 patent, tend to suffer from a number of problems. First, it is sometimes difficult to initiate or maintain crystal growth with conventional large-size EFG dies, such as dies for growing octagons and nonagons having 4" wide faces. Secondly, it tends to be difficult to grow crystalline bodies with uniform thickness around the circumference thereof. Thirdly, in conjunction with initiation and/or termination of the crystal growth process, and also at other times in the growth process, it is not uncommon for liquid silicon to flood over the die and adjacent parts of the crystal growth apparatus. The wet-tip die of the present invention is designed to reduce or eliminate these problems.

More specifically, a die designed according to this invention assures that crystal growth may be satisfactorily initiated and maintained over a wider range of temperatures than with conventional EFG dies. With a die designed according to the invention, the melt level in the crucible is higher relative to top surface 102 than with conventional EFG dies. Also the top surface 102 may be made wider than the top surface of conventional EFG dies. Due to these changes in the configuration of die tip 100, the growth menisci 110A and 110B tend to be taller than the growth menisci associated with conventional EFG dies. Because the growth menisci 110A and 110B are taller, the temperature difference between top surface 102 and the melt/solid interface at the bottom of the growing crystal is greater than with conventional EFG dies. This increase in temperature differential increases the ability of the growing crystal to tolerate temperature variations around the circumference of the die without freezing to the die or detaching from the meniscus.

Considering now the manner in which the present invention reduces the second problem, die 18 is designed so that the temperature, surface characteristics, and edge configuration of the die tip 100 remain more uniform during the growth process than is true with conventional EFG dies. With the present invention, the inner and outer outside surfaces 104 and 106 and the top surface 102 of the die tip 100 remain wetted with liquid silicon during the entire growth process. On the other hand, with known EFG dies, certain sections of the outer surface of the die tip may be covered with liquid silicon due to spills and other mishaps, while the remainder of the die is dry, i.e. not contacted by melt. Because liquid silicon has about twice the thermal conductivity and about half the emissivity of graphite, local hot spots are formed on the side surfaces of conventional EFG dies due to the spilled liquid silicon. As such, the temperature around the circumference of conventional EFG dies is not uniform, with the result that the wall thickness of a crystalline body grown using a conventional EFG die is not uniform around the circumference of the body. This problem is avoided with the present invention because by maintaining the entire outer surface of die tip 100 in a wetted state, temperature variations caused by interspersed wet and dry regions are avoided.

Furthermore with respect to the second problem, because the entire outside surface of die tip 100 remains wetted by molten silicon during the crystal growth process, the formation of silicon carbide in capillary 108 and on the outside surface of the die tip is significantly reduced, or at least made more uniform and hence less harmful since it is mostly submerged in the melt. As is known, silicon carbide deposits tend to develop on those portions of known EFG die tips on which liquid silicon is in contact. Because silicon carbide has a different conductivity and emissivity than graphite, local temperature differences in the die tip of known EFG dies are caused by silicon carbide deposits. These local temperature differences cause variations in the circumferential thickness of a crystalline body grown from the die on which the silicon carbide is deposited.

In addition to affecting the thermal profile of the die, silicon carbide deposits may also change the surface characteristics and/or the edge configuration of the top surface of the die tip. As a consequence, the configuration of a grown crystalline body may be affected by the deposited silicon carbide.

Because silicon carbide grows in a porous crystal structure, it actually forms a permeable structure which can draw and hold additional silicon from the die-top, and build up in a self-perpetuating manner in capillary 108. The build-up of silicon carbide changes the geometry of the die, causing variations in thickness of the crystal, and possibly preventing melt from flowing to the growth film 110.

Further with regard to the second problem, die 18 contains openings, passageways, and other cavities in areas where known EFG dies contain solid structure, i.e., graphite. Inasmuch as these cavities in die 18 contain liquid silicon during the crystal growth process instead of graphite, heat transfer is improved because liquid silicon has more than twice the thermal conductivity of graphite. Furthermore, because liquid silicon is more uniform in its properties than graphite, the temperature of die tip 100 tends to be more uniform around the circumference thereof with die unit 18 than with conventional EFG dies.

The design of die unit 18 is such that silicon carbide deposits that do develop can be accommodated without causing corresponding local change, or with causing only a minimal local change, in the thickness of the growing crystalline body. Specifically, because capillary slot 108 and die top surface 102 are relatively wide, the flat portions of the die top can accumulate a relatively large quantity of silicon carbide without altering the shape of the growth meniscus.

Another aspect of the design of die unit 18 leads to increased uniformity of temperature around the circumference of the die 19, which in turn permits the growth of crystalline bodies having more uniform wall thickness. Because die 19 may be about one third as high and almost twice as wide as known EFG dies of the type shown in U.S. Pat. No. 4230674, and because the wet die tip region contains mostly liquid silicon instead of graphite, the heat conductance in the vertical direction of the die tip 100 is increased dramatically. As a result of this increase, the temperature drop between the bulk melt in crucible 24 and die top surface 102 is reduced. Resultantly, the maximum temperature of the liquid silicon in crucible 24 or in contact with capillary passages 180 is reduced. The maximum temperature of the melt in contact with the graphite crucible is further reduced, as compared with prior crucible/die assemblies, by having passageways 180 inclined to die tip 100 so they extend roughly parallel to the temperature isotherms in the die. With conventional EFG dies, capillary passageways extend more vertically and cross more temperature isotherms as they penetrate down into the hottest region of the die/crucible unit (the lower outside corner of the crucible). Because the liquid silicon transported through passageways 180 passes parallel to temperature isotherms, the maximum temperature of the liquid silicon in contact with the graphite in those passageways is reduced, and as a result, dissolution of the crucible and precipitation of the dissolved crucible material in capillary slot 108 and at the die top surface 102 are both reduced. This in turn tends to improve the homogeneity of the growing crystalline body due to a reduction in impurities segregation.

It is to be noted that passages 180 are formed by drilling down from the top of the die. They are inclined and pass through the die tip and the side wall of the crucible, intersecting the two moats 104 and 116 and the die feed capillary 108. The inclined nature of passages 180 offers several advantages. First of all, as noted above, passages 180 eliminate or prevent the melt from travelling into areas of the die structure where the temperature is relatively high and hence more conducive to silicon carbide formation. In other words, the inclined passages tend to reduce the maximum temperature of the graphite/silicon interface in the region travelled by the silicon melt as it moves from the crucible to the top surface of the die.

Secondly, passages 180 serve to distribute melt to the two overflow moats 114 and 116 as well as to capillary slot 108. Thirdly, because of the inclined angle, melt flowing in passages 180 to capillary 108 undergo less lateral flow than occurs in prior EFG dies. Fourthly, passages 180 are easier and less expensive to make than the passages that feed melt from the crucible to the die capillary in prior art dies. As a consequence, it is economically feasible and practical to provide a relatively large number of passages 180 arranged in close proximity to one another about the axis of the die. Hence not only can passages 180 be inclined more nearly parallel to the isotherms in the die, but the relatively large number and relatively close spacing of passages 180 reduces the need for the melt to undergo lateral flow in the capillary slot and at the die top. A reduction in lateral flow of melt in the die is advantageous in reducing impurity segregation and precipitation.

As a result, not only may the novel die of this invention be made shallow, but also it is more nearly isothermal. To summarize, the reduction in the temperature of the liquid silicon in the crucible and in the capillary passageways caused by the factors listed above reduces the tendency of the liquid silicon to dissolve carbon from the graphite die. Reducing the tendency to precipitate carbon by reaction with liquid silicon causes less silicon carbide to deposit onto die tip 100. Such reduction is a significant advantage, since, as discussed above, silicon carbide deposits cause temperature differences and alter the shape of the die tip, which in turn cause variations in the thickness of the crystalline body grown from the die tip. Such reduction is a significant advantage also because silicon carbide deposits can clog the capillary passages of dies of conventional design, thereby preventing flow of melt to the growth meniscus and thus limiting the useful life of the die, while a die incorporating the present invention has a much longer useful life.

Die 19 also is designed to overcome the third problem noted above, i.e. the flooding of liquid silicon over the die and adjacent regions of the crystal growth apparatus. By providing inner and outer moats 114 and 116 adjacent die tip 100, most spillage of liquid silicon from growth meniscus 110 is captured in the moats and recycled for subsequent crystal growth. In the event a relatively large spill occurs, liquid silicon may be captured in outermost moat 170. Thus the problems associated with spilled silicon in known EFG dies are avoided.

Certain changes and modifications may be made in the above device without departing from the scope of the invention herein involved. Thus, for example, the top end surface of die tip 100 may have circular, elliptical, triangular, rectangular, or other configurations, depending upon what shape body is to be grown. Also, the relative dimensions of different portions of the die/crucible assembly may be varied. The third moat also may be omitted since it is not necessary for the die to function satisfactorily. However, having a third moat to capture melt when a spill occurs is preferred since it prevents damage to other components in the growth zone. The size and design of the crucible/die assembly may also be changed without departing from the principles of the present invention. Thus, for example, the crucible and EFG die may formed as two separate and distinct members that are assembled to one another so as to form the functional equivalent of the crucible/die arrangement shown in the drawings. In such an alternative embodiment, the passages 180 will be part of the separately formed die.

Still other possible modifications will be obvious to persons skilled in the art. Therefore, it is intended that all matter contained in the above description or shown in the accompanying drawings shall be interpreted in an illustrative and not in a limiting sense.

As used herein, the term "tubular" means a hollow elongate body having a cross-sectional shape in the form of a ring that preferably has a polygonal configuration, e.g, an octagon or nonagon, but alternatively may have a circular or other configuration.

What is claimed is:

1. Apparatus for growing a tubular crystalline body of a selected material by the EFG process, the apparatus comprising:
    (a) a crucible having a bottom wall and a side wall defining an interior space for containing a liquid supply of said selected material, and (b) an improved capillary die formed integral with said side wall;
    said die comprising tip means for use in supporting a liquid/solid growth interface and for controlling the configuration of said crystalline body, said tip means comprising a top end surface and inner and outer exterior surfaces intersecting said top end surface, and transport means for (a) transporting said selected material in liquid form by capillary action from said crucible to said tip means so that said top end surface and said inner and outer exterior surfaces are constantly wetted with said melt during the growth of said crystalline body.

2. Apparatus according to claim 1 wherein said inner and outer exterior surfaces extend substantially perpendicularly to the plane of said top end surface.

3. Apparatus according to claim 1 wherein said transport means comprises at least one capillary which intersects said top end surface.

4. Apparatus according to claim 1 comprising first and second moat means for maintaining first and second pools of melt in engagement with said inner and outer exterior surfaces.

5. Apparatus according to claim 1 wherein said transport means comprises:
    first moat means adjacent said inner exterior surface of said tip means for containing a first pool of said melt; and
    second moat means adjacent said outer exterior surface of said tip means for containing a second pool of said melt.

6. Apparatus according to claim 5 wherein said transport means comprises a first capillary passage in said tip means which intersects said top end surface of said tip means, and means for delivering said selected material in liquid form from said crucible to said first capillary passage.

7. Apparatus according to claim 5 further comprising a third moat means positioned in surrounding and spaced relation to said second moat means for containing melt which has overflowed from said tip means or said second moat means.

8. Apparatus according to claim 1 wherein the width of said top end surface, as measured between the intersections of said inner and outer exterior surfaces with said top surface, ranges from 0.02" to 0.20".

9. Apparatus according to claim 1 wherein said transport means comprises a capillary for transporting melt to said top end surface, and inclined passages connecting the interior of said crucible to said capillary.

10. An apparatus for growing a tubular crystalline body of a selected material by the EFG process comprising:
    a crucible for containing a melt of said selected material;
    heating means for heating said crucible;
    growing means for growing a tubular crystalline body of said selected material from said melt, said growing means comprising (1) seed holder means for supporting a seed onto which said crystalline body is grown and (2) pulling means for pulling said tubular crystalline body and said seed holder means away from said crucible; and
    forming means formed integral with said crucible comprising tip means for supporting a film of said selected material from which said hollow tubular body is grown and for determining the cross-sectional configuration of said crystalline body, said tip means comprising a top end surface and inner and outer exterior surfaces intersecting said top end surface, capillary means for transporting said selected material in molten state by capillary action from said crucible to said top end surface, and passage means for transporting said selected material in molten state from said crucible to said inner and outer exterior surfaces so that said inner and outer exterior surfaces are wetted with said selected material during growth of said crystalline body.

11. Apparatus according to claim 10 wherein said passage means comprises a plurality of inclined passages leading from the interior of said crucible to said capillary means.

12. Apparatus according to claim 11 wherein said inclined passages are inclined at an angle of about 30 degrees to the horizontal.

13. Apparatus according to claim 12 further including first and second moats located on opposite sides of said die tip, with said inner exterior surface forming part of said first moat and said outer exterior surface forming part of said second moat.

* * * * *